(12) United States Patent
Ma et al.

(10) Patent No.: US 10,290,728 B2
(45) Date of Patent: May 14, 2019

(54) SEMICONDUCTOR DEVICE AND MANUFACTURING METHOD THEREOF

(71) Applicant: United Microelectronics Corp., Hsinchu (TW)

(72) Inventors: Chu-Ming Ma, Kaohsiung (TW);
Chun-Yi Lin, Hualien County (TW);
Hung-Chi Huang, Tainan (TW);
Hsien-Ta Chung, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 68 days.

(21) Appl. No.: 15/487,817

(22) Filed: Apr. 14, 2017

(65) Prior Publication Data

US 2018/0261692 A1    Sep. 13, 2018

(30) Foreign Application Priority Data

Mar. 9, 2017   (TW) .............................. 106107680 A

(51) Int. Cl.
| | | |
|---|---|---|
| *H01L 29/36* | (2006.01) | |
| *H01L 29/49* | (2006.01) | |
| *H01L 29/66* | (2006.01) | |
| *H01L 21/283* | (2006.01) | |
| *H01L 29/423* | (2006.01) | |
| *H01L 29/739* | (2006.01) | |

(52) U.S. Cl.
CPC ........ *H01L 29/7397* (2013.01); *H01L 21/283* (2013.01); *H01L 29/36* (2013.01); *H01L 29/42364* (2013.01); *H01L 29/4916* (2013.01); *H01L 29/66348* (2013.01)

(58) Field of Classification Search
CPC ........... H01L 29/7397; H01L 29/66348; H01L 29/4916; H01L 29/36
See application file for complete search history.

(56) References Cited

U.S. PATENT DOCUMENTS

| | | | |
|---|---|---|---|
| 7,868,394 B2 | 1/2011 | Kao | |
| 8,541,833 B2 | 9/2013 | Schulze et al. | |
| 2010/0285646 A1* | 11/2010 | Lin | H01L 21/26586 438/270 |
| 2012/0326207 A1* | 12/2012 | Yoshimochi | H01L 29/7397 257/139 |

* cited by examiner

*Primary Examiner* — Changhyun Yi
(74) *Attorney, Agent, or Firm* — J.C. Patents

(57) ABSTRACT

A semiconductor device and a manufacturing method thereof are provided. The semiconductor device includes a substrate, a first doped region, a second doped region, a first dielectric layer, a third doped region, a fourth doped region, a second dielectric layer and a conductive layer. The substrate has a first trench in a first area and a second trench in a second area. The first and second doped regions are disposed in the substrate respectively at two side of the first trench. The first dielectric layer is disposed on the sidewall of the first trench. The third doped region is disposed around the second trench. The fourth doped region is disposed in the third doped region at one side of the second trench. The second dielectric layer is disposed on the sidewall and bottom of the second trench. The conductive layer is disposed in the first and second trenches.

20 Claims, 6 Drawing Sheets

SEMICONDUCTOR DEVICE AND MANUFACTURING METHOD THEREOF

CROSS-REFERENCE TO RELATED APPLICATION

This application claims the priority benefit of Taiwan application serial no. 106107680, filed on Mar. 9, 2017. The entirety of the above-mentioned patent application is hereby incorporated by reference herein and made a part of this specification.

BACKGROUND OF THE INVENTION

Field of Invention

The present invention relates to a semiconductor device and a manufacturing method thereof, and particularly to a semiconductor device having different deep trench structures and a manufacturing method thereof.

Description of Related Art

As a semiconductor device and elements contained therein are continuously reduced, deep trench structures are often adopted to isolate the elements in the semiconductor device from each other. For a semiconductor device having different deep trench structures, considerable steps are required in the manufacturing process due to the structural differences of the deep trench structures, and thus, the process complexity is increased and the production cost is expensive.

A semiconductor device having an insulated gate bipolar transistor (IGBT) element is taken as an example. In a periphery area, a conductive layer in a deep trench is electrically connected to a substrate for achieving an effective isolation. However, in an IGBT element area, an insulating layer is located on the bottom of another deep trench for avoiding an electrical connection between another conductive layer in another deep trench and the substrate. Therefore, considerable steps are required in the manufacturing process of such semiconductor device due to the structural differences of the deep trenches. The process complexity and therefore the production cost cannot be effectively reduced.

SUMMARY OF THE INVENTION

Accordingly, the present invention provides a semiconductor device having different deep trench structures.

The present invention further provides a manufacturing process by which a semiconductor device having different deep trench structures is formed.

The present invention provides a semiconductor device including a substrate, a first doped region, a second doped region, a first dielectric layer, a third doped region, a fourth doped region, a second dielectric layer and a conductive layer. The substrate has a first trench in a first area and a second trench in a second area. The first doped region and a second doped region are disposed in the substrate respectively at two sides of the first trench. The first dielectric layer is disposed on a sidewall of the first trench. The third doped region is disposed around the second trench. The fourth doped region is disposed in the third doped region at one side of the second trench. The second dielectric layer is disposed on a sidewall and a bottom of the second trench. The conductive layer is disposed in the first trench and the second trench.

According to an embodiment of the present invention, the first doped region and the fourth doped region have a first conductivity type, and the second doped region and the third doped region have a second conductivity type.

According to an embodiment of the present invention, the semiconductor device further includes a fifth doped region and a sixth doped region. The fifth doped region is disposed in the third doped region at another side of the second trench. The sixth doped region is disposed in the fourth doped region. The fifth doped region has the first conductivity type, and the sixth doped region has the second conductivity type.

According to an embodiment of the present invention, a thickness of the first dielectric layer ranges from about 500 Å to 1,500 Å.

According to an embodiment of the present invention, a thickness of the second dielectric layer ranges from about 100 Å to 400 Å.

According to an embodiment of the present invention, a width of the first trench is equal to a width of the second trench, and a depth of the first trench is equal to a depth of the second trench.

According to an embodiment of the present invention, a width of the first trench is greater than a width of the second trench, and a depth of the first trench is greater than a depth of the second trench.

According to an embodiment of the present invention, a protruding height, from a surface of the substrate, of the conductive layer in the first trench is equal to a protruding height, from the surface of the substrate, of the conductive layer in the second trench.

According to an embodiment of the present invention, the conductive layer includes doped polysilicon.

According to an embodiment of the present invention, the conductive layer in the first trench is electrically connected to the substrate.

The present invention further provides a manufacturing method of a semiconductor device that includes the following steps. A first doped region and a second doped region are formed in a substrate in a first area. A third doped region is formed in the substrate in a second area. A fourth doped region is formed in the third doped region. A first patterning process is performed, so as to form a first trench in the substrate between the first doped region and the second doped region, and form a second trench in the third doped region, wherein the fourth doped region is located at one side of the second trench. A first dielectric layer is formed on a sidewall of the first trench. A second dielectric layer is formed on a sidewall and a bottom of the second trench. A conductive layer is formed to fill the first trench and the second trench.

According to an embodiment of the present invention, the first doped region and the fourth doped region have a first conductivity type, and the second doped region and the third doped region have a second conductivity type.

According to an embodiment of the present invention, the manufacturing method further includes forming a fifth doped region in the third doped region, wherein the fifth doped region is located at another side of the second trench; and forming a sixth doped region in the fourth doped region, wherein the fifth doped region has the first conductivity type, and the sixth doped region has the second conductivity type.

According to an embodiment of the present invention, a width of the first trench is equal to a width of the second trench, and a depth of the first trench is equal to a depth of the second trench.

According to an embodiment of the present invention, a width of the first trench is greater than a width of the second trench, and a depth of the first trench is greater than a depth of the second trench.

According to an embodiment of the present invention, a method of forming the first dielectric layer includes forming a nitride layer on the substrate; forming a mask layer to cover the second area; removing the nitride layer in the first area by using the mask layer as a mask; removing the mask layer; forming an oxide layer on the sidewall of the first trench; and removing the nitride layer in the second area.

According to an embodiment of the present invention, a method of forming the second dielectric layer includes forming a nitride layer on the substrate; forming a mask layer to cover the first area; removing the nitride layer in the second area by using the mask layer as a mask; removing the mask layer; forming an oxide layer on the sidewall and the bottom of the second trench; and removing the nitride layer in the first area.

According to an embodiment of the present invention, a method of forming the conductive layer includes forming a conductive material layer on the substrate, wherein the conductive material layer fills the first trench and the second trench; and performing a second patterning process to remove the conductive material layer around the first trench and the second trench.

According to an embodiment of the present invention, a protruding height, from a surface of the substrate, of the conductive layer in the first trench is equal to a protruding height, from the surface of the substrate, of the conductive layer in the second trench.

According to an embodiment of the present invention, the conductive layer in the first trench is electrically connected to the substrate.

In view of the above, in the present invention, a single patterning process is performed to form trenches in a substrate respectively in first and second areas, and thus, the number of photomasks is decreased, the manufacturing process is simplified, and the production cost is accordingly reduced. Besides, in the present invention, the conductive layer in different trenches is formed in the same process step, so as to reduce the process complexity and therefore the production cost.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
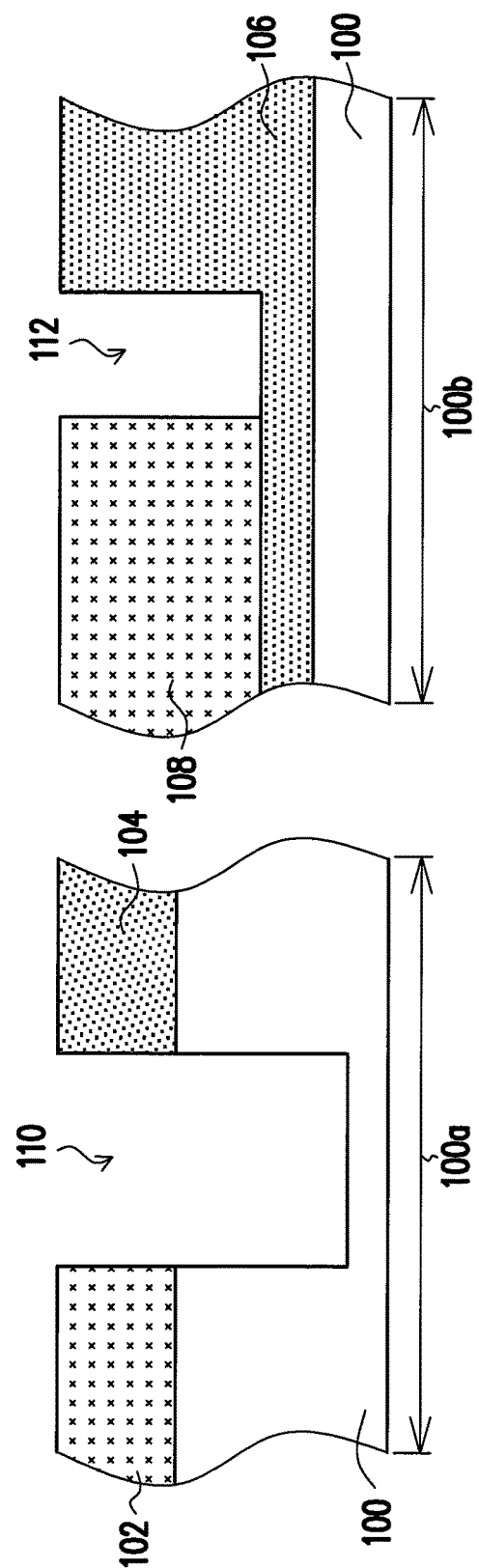
FIG. 1A to FIG. 1F are schematic cross-sectional views of a manufacturing process of a semiconductor device according to an embodiment of the present invention.

The present invention may be embodied in various forms and is not limited to the embodiments described herein. For the sake of clarity, the same reference numbers are used in the drawings and the description to refer to the same or like parts.

FIG. 1A to FIG. 1F are schematic cross-sectional views of a manufacturing process of a semiconductor device according to an embodiment of the present invention. Referring to FIG. 1A, a substrate 100 is provided. The substrate 100 can be a silicon substrate. In this embodiment, the substrate 100 is a P-type silicon substrate. The substrate 100 has a first area 100a and a second area 100b. In this embodiment, the first area 100a is the area where a logic element is to be formed, and the second area 100b is the area where an IGBT element is to be formed. However, the present invention is not limited thereto. Thereafter, ion implantation processes are performed, so as to form doped regions 102 and 104 in the substrate 100 in the first area 100a, form a doped region 106 in the substrate 100 in the second area 100b, and form a doped region 108 in the doped region 106. The doped region 102 has a conductivity type opposite to that of the doped regions 104 and 106, and the conductivity type of the doped region 102 is the same as that of the doped region 108. In this embodiment, the doped regions 102 and 108 are doped with a P-type dopant, and the doped regions 104 and 106 are doped with an N-type dopant. However, the present invention is not limited thereto. In another embodiment, the doped regions 102 and 108 are doped with an N-type dopant, and the doped regions 104 and 106 are doped with a P-type dopant. The doped regions 102, 104, 106 and 108 are formed by the method known to people having ordinary skill in the art, and the details are not iterated herein.

In this embodiment, the doped regions 102 and 108 of the same conductivity type are formed with different implantation steps because their doping concentrations and depths are different. However, the present invention is not limited thereto. In another embodiment, depending on the doping concentration and depth of the doped region 108, the doped regions 102 and 108 can be formed with the same doping concentration and depth. Therefore, the doped regions 102 and 108 can be formed in the same implantation step. Similarly, depending on the doping concentration and depth of the doped region 106, the doped regions 104 and 106 of the same conductivity type can be formed in the same implantation step, so as to have the same doping concentration and depth. Alternatively, the doped regions 104 and 106 can be formed in different implantation steps, so as to have respective doping concentrations and depths. It is beneficial to reduce the process steps and therefore the production cost when the doped regions (doped regions 102 and 108, doped regions 104 and 106) of the same conductivity type are formed in the same process step.

Thereafter, a patterning process is performed to remove a portion of the substrate 100, and therefore form a trench 110 in the substrate 100 between the doped region 102 and the doped region 104, and form a trench 112 in the doped region 106. The doped region 108 is at one side of the trench 112. In the first area 100a, the trench 110 is configured to separate the doped region 102 from the doped region 104, such that individual elements subsequently and respectively formed in the doped region 102 and the doped region 104 can be electrically isolated from each other. In this embodiment, in the second area 100b, the trench 112 exposes the doped region 106, and the bottom of the trench 112 is as deep as the bottom of the doped region 108. However, the present invention is not limited thereto. In another embodiment, the bottom of the trench 112 can be deeper than the bottom of the doped region 108. The depth of the trench 110 ranges from about 20 μm to 30 μm, preferably about 25 μm. The depth of the trench 112 ranges from about 10 μm to 20 μm, preferably about 15 μm.

Generally speaking, during a patterning process of forming trenches, the same etching step (with equal etching time) enables a trench with a wider opening to be formed deeper and a trench with a narrower opening to be formed shallower. In other words, the depth of the trench can be controlled by adjusting the opening width of the same trench. In this embodiment, since the opening width of the trench 112 is smaller than the opening width of the trench 110, so the trench 112 is formed with a depth less than that of the trench 110 after a single patterning process. However, the present invention is not limited thereto. In another embodiment, depending on the depth of the trench 112, the opening width of the trench 110 can be adjusted, such that the trench 110 and the trench 112 can be formed with the same depth after a single patterning process.

Besides, in this embodiment, a single patterning process is performed to form the trenches 110 and 112 in the substrate 100 respectively in the first and second areas 100a and 100b, and thus, the number of photomasks is decreased, the manufacturing process is simplified, and the production cost is accordingly reduced.

Figure 1B:
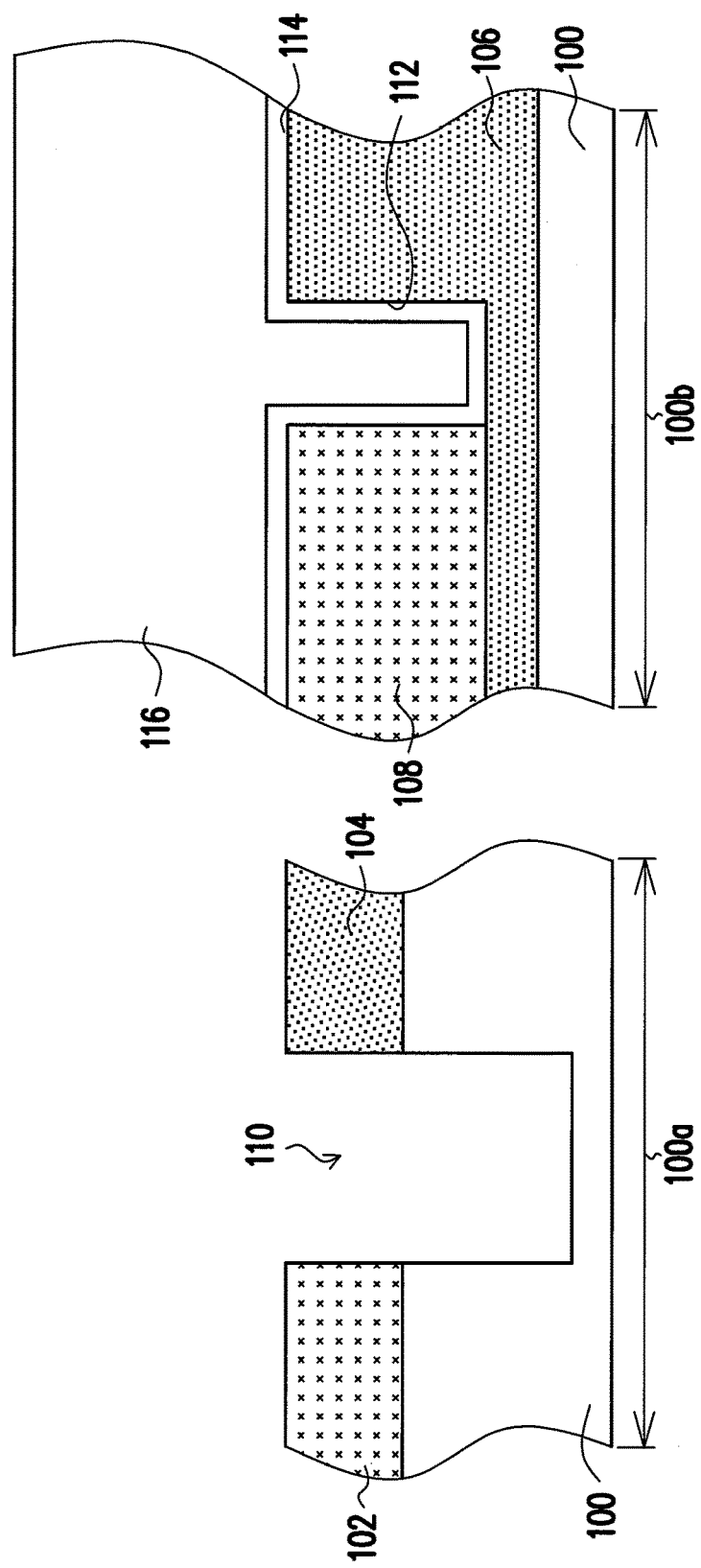

Referring to FIG. 1B, a pad layer 114 is formed on the substrate 100. In this embodiment, the pad layer 114 is conformally formed on the substrate 100. The pad layer 114 can be a nitride layer, and the forming method thereof includes performing a CVD process. Thereafter, a mask layer 116 is formed on the substrate 100 in the second area 100b. The mask layer 116 covers the substrate 100 in the second area 100b and completely fills the trench 112. The mask layer 116 can be a photoresist layer. An etching process is then performed by using the mask layer 116 as an etching mask, so as to remove the pad layer 114 (uncovered by the mask layer 116) from the first area 100a.

Figure 1C:
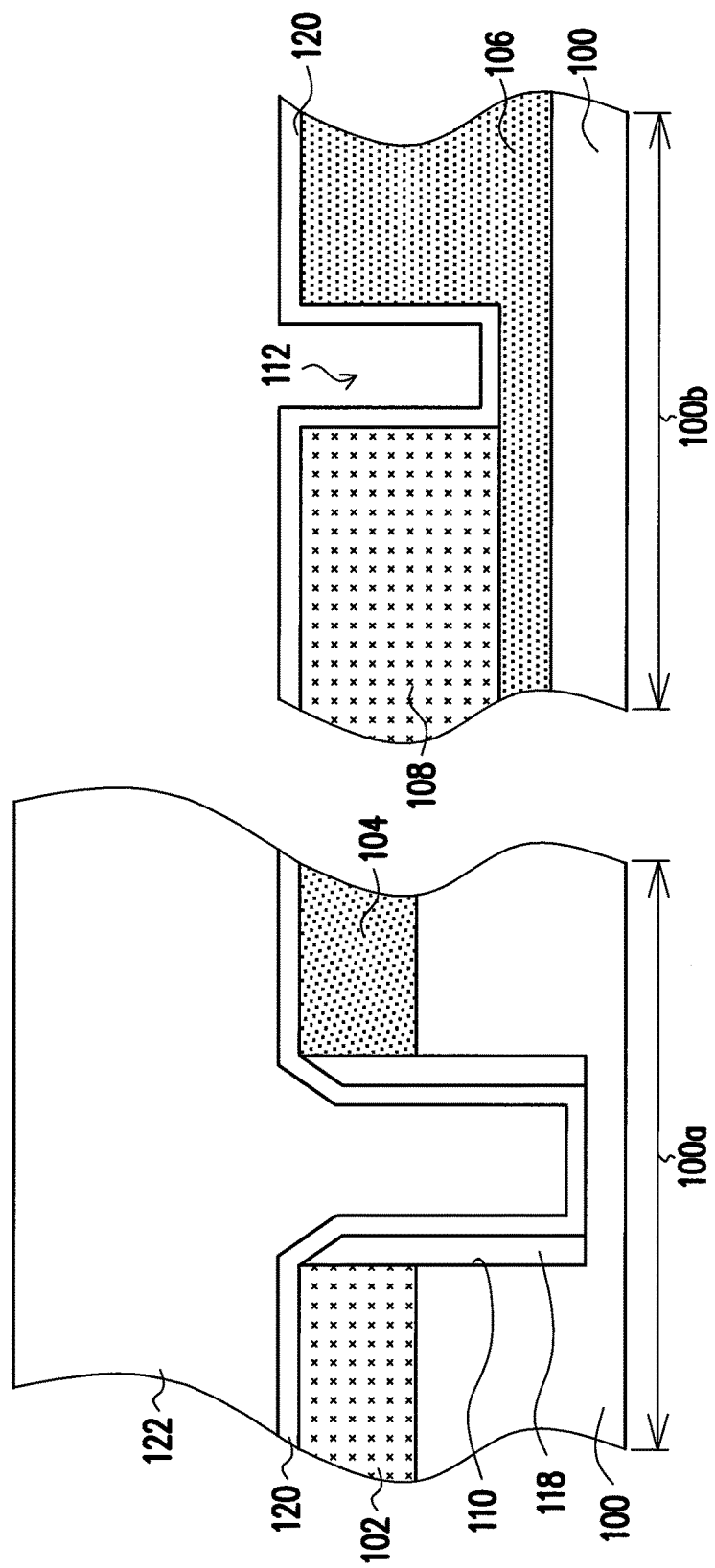

Referring to FIG. 1C, the mask layer 116 is removed. Thereafter, a collar oxide layer 118 is formed on the sidewall of the trench 110. The thickness of the collar oxide layer 118 ranges from 500 Å to 1,500 Å, preferably about 800 Å. In this embodiment, the method of forming the collar oxide layer 118 includes performing an oxidizing treatment to conformally form an oxide layer on the substrate 100, and then performing an anisotropic etching process to remove the oxide layer on the surface of the substrate 100 and on the bottom of the trench 110. It is noted that, during the oxidizing treatment, the oxide layer is not only formed on the surface of the substrate 100 and on the sidewall and bottom of the trench 110, but also slightly formed on the pad layer 114 in the second area 110b. The oxide layer formed on the pad layer 114 in the second area 110b is simultaneously removed during the anisotropic etching process. It is noted that in this step, the bottom of the trench 110 is exposed after the collar oxide layer 118 is formed.

Afterwards, the pad layer 114 in the second area 110b is removed. The method of removing the pad layer 114 includes performing an isotropic etching process. The collar oxide layer 118 (e.g., oxide layer) and the pad layer 114 (e.g., nitride layer) includes different materials, so the collar oxide layer 118 remains on the sidewall of the trench 110 during the step of removing the pad layer 114. Thereafter, a pad layer 120 is formed on the substrate 100. In this embodiment, the pad layer 120 is conformally formed on the substrate 100. The pad layer 120 can be a nitride layer, and the forming method thereof includes performing a CVD process. Afterwards, a mask layer 122 is formed on the substrate 100 in the first area 100a. The mask layer 122 covers the substrate 100 in the first area 100a and completely fills the trench 110. The mask layer 122 can be a photoresist layer.

Figure 1D:
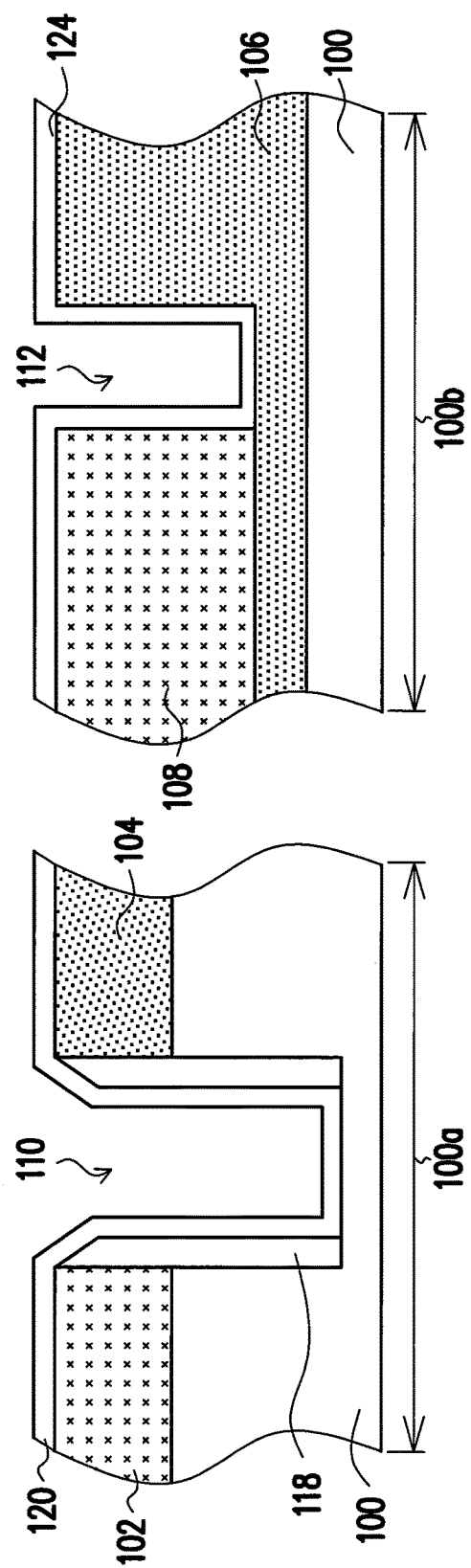

Referring to FIG. 1D, an etching process is performed by using the mask layer 122 as an etching mask, so as to remove the pad layer 120 (uncovered by the mask layer 122) from the second area 100b. The mask layer 122 is then removed. Thereafter, a liner layer 124 is formed on the substrate 100. The thickness of the liner layer 124 ranges from about 100 Å to 400 Å, preferably about 200 Å. In this embodiment, the liner layer 124 is conformally formed on the substrate 100. The liner layer 124 can be an oxide layer, and the forming method thereof includes performing a thermal oxide process. It is noted that, during the thermal oxide process, the oxide layer is not only formed on the surface of the substrate 100 and on the sidewall and bottom of the trench 112, but also slightly formed (not shown) on the pad layer 120 in the first area 110a.

Figure 1E:
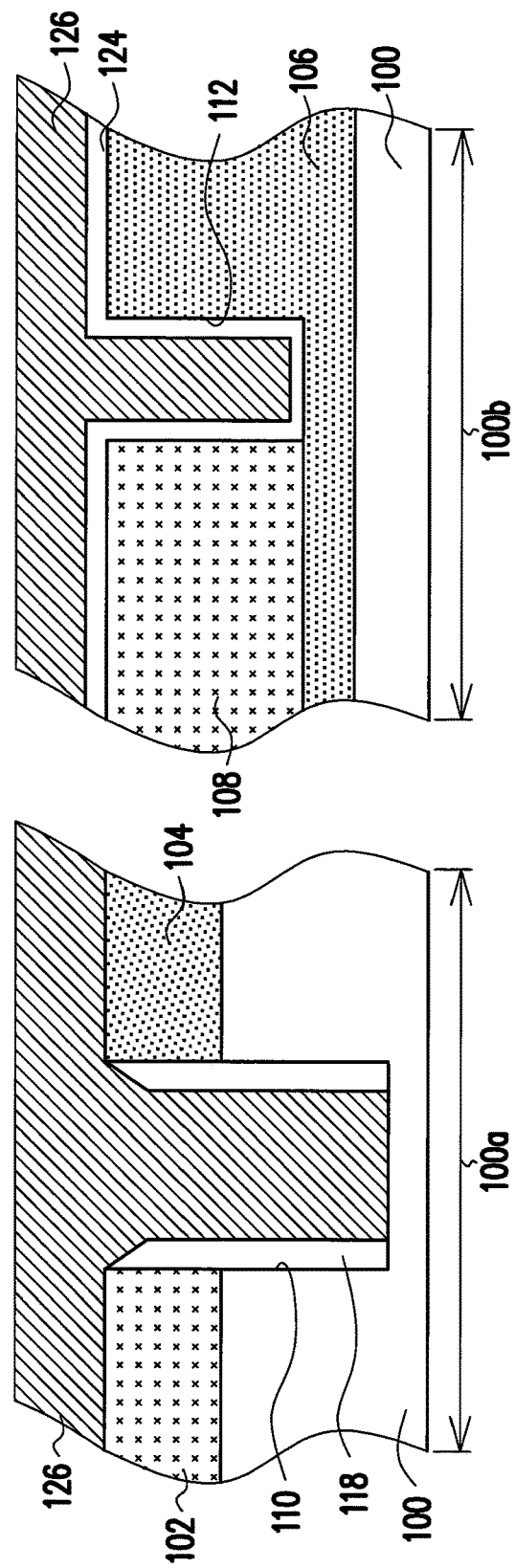

Referring to FIG. 1E, the pad layer 120 in the first area 110a is removed. The method of removing the pad layer 120 includes performing an isotropic etching process. The liner layer 124 (e.g., oxide layer) and the pad layer 120 (e.g., nitride layer) include different materials, so the liner layer 124 remains in the second area 100b during the step of removing the pad layer 120. Besides, the liner layer 124 slightly formed on the pad layer 120 can be simultaneously removed during the isotropic etching process of removing the pad layer 120 in the first area 110a. It is noted that, after this step, the bottom of the trench 112 is not exposed but is covered by the liner layer 124. In other words, in this embodiment, the deep trench structure (including the trench 110 and the collar oxide layer 118 therein) in the first area 100a is different from the deep trench structure (including the trench 112 and the liner layer 124 therein) in the second area 100b. Specifically, the bottom of the trench 110 is not covered by an oxide layer, while the bottom of the trench 112 is covered by an oxide layer.

Afterwards, a conductive material layer 126 is formed on the substrate 100 and fills the trenches 110 and 112, e.g. completely fills the trenches 110 and 120. In this embodiment, the conductive material layer 126 can be a doped polysilicon layer, and the forming method thereof includes performing a CVD process.

Figure 1F:
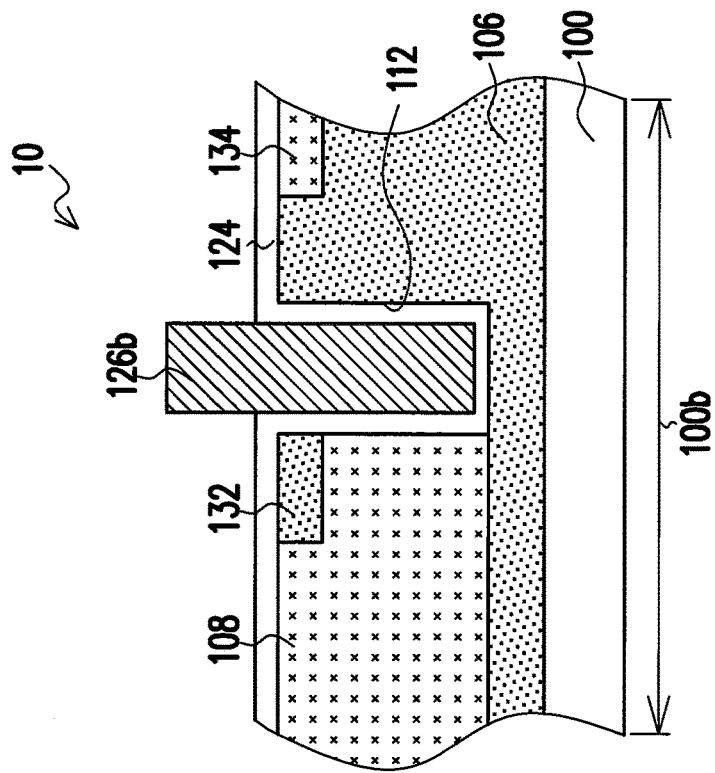
Figure 1F:
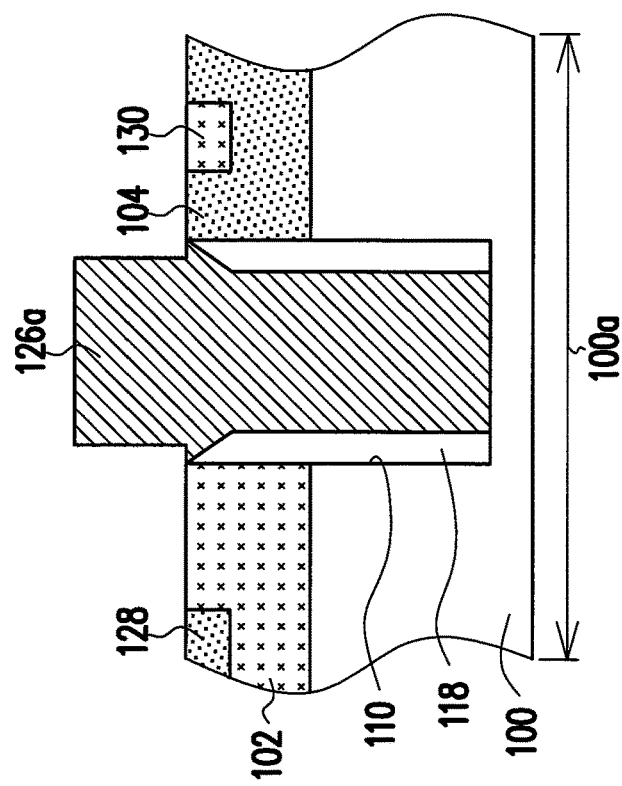

Referring to FIG. 1F, a patterning process performed to remove the conductive material layer 126 around the trenches 110 and 112, so as to form a conductive layer 126a in the trench 110 and form a conductive layer 126b in the trench 112. Thereafter, ion implantation processes are performed, so as to form a doped region 128 having a conductivity type opposite to that of the doped region 102 in the doped region 102, form a doped region 130 having a conductivity type opposite to that of the doped region 104 in the doped region 104, form a doped region 134 having a conductivity type opposite to that of the doped region 106 in the doped region 106, and form a doped region 132 having a conductivity type opposite to that of the doped region 108 in the doped region 108. The manufacture of the semiconductor device 10 of this embodiment is thus completed. The doped region 128, 130, 132 and 134 are formed by the method known to people having ordinary skill in the art, and the details are not iterated herein. In the semiconductor device 10, the doped region 128, 130, 132 and 134 respectively serve as terminals (source/drain regions) that electrically connect the doped region 102, 104, 106 and 108 to other elements.

In this embodiment, the semiconductor device 10 includes different deep trench structures. In the deep trench structure in the first area 100a, the bottom of the trench 110 is not covered by an oxide layer (e.g., collar oxide layer 118), such that the conductive layer 126a formed in the trench 110 is electrically connected to the substrate 100. In the deep trench structure in the second area 100b, the bottom of the trench 112 is covered by an oxide layer (e.g., liner layer 124), such that the conductive layer 126b formed in the trench 112 is electrically isolated from the substrate 100.

Besides, in this embodiment, since the conductive layer 126a in the trench 110 and the conductive layer 126b in the trench 112 are formed in the same process step, and thus, the conductive layer 126a and conductive layer 126b have the same material and thickness. That is, the protruding height, from the surface of the substrate 100, of the conductive layer 126a is equal to the protruding height, from the same surface of the substrate 100, of the conductive layer 126b. In addition, the conductive layer 126a and the conductive layer 126b are formed in the same process step, so as to simply the process steps and therefore reduce the production cost.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A semiconductor device, comprising:
a substrate, having a first trench in a first area and a second trench in a second area;
a first doped region and a second doped region, disposed in the substrate respectively at two sidewalls of the first trench;
a first dielectric layer, disposed on the two sidewalls of the first trench and exposing a portion of the substrate at a bottom of the first trench;
a third doped region, disposed around the second trench, including a portion of the third doped region under a bottom of the second trench;
a fourth doped region, disposed in the third doped region at one side of the second trench;
a second dielectric layer, disposed on a sidewall and the bottom of the second trench; and
a conductive layer, disposed in the first trench and the second trench.

2. The semiconductor device of claim 1, wherein the first doped region and the fourth doped region have a first conductivity type, and the second doped region and the third doped region have a second conductivity type.

3. The semiconductor device of claim 2, further comprising a fifth doped region and a sixth doped region, wherein the fifth doped region is disposed in the third doped region at another side of the second trench, the sixth doped region is disposed in the fourth doped region, the fifth doped region has the first conductivity type, and the sixth doped region has the second conductivity type.

4. The semiconductor device of claim 1, wherein a thickness of the first dielectric layer ranges from 500 Å to 1,500 Å.

5. The semiconductor device of claim 1, wherein a thickness of the second dielectric layer ranges from 100 Å to 400 Å.

6. The semiconductor device of claim 1, wherein a width of the first trench is equal to a width of the second trench, and a depth of the first trench is equal to a depth of the second trench.

7. The semiconductor device of claim 1, wherein a width of the first trench is greater than a width of the second trench, and a depth of the first trench is greater than a depth of the second trench.

8. The semiconductor device of claim 1, wherein a protruding height, from a surface of the substrate, of the conductive layer in the first trench is equal to a protruding height, from the surface of the substrate, of the conductive layer in the second trench.

9. The semiconductor device of claim 1, wherein the conductive layer comprises doped polysilicon.

10. The semiconductor device of claim 1, wherein the conductive layer in the first trench is electrically connected to the substrate.

11. A manufacturing method of a semiconductor device, comprising:
forming a first doped region and a second doped region in a substrate in a first area;
forming a third doped region in the substrate in a second area;
forming a fourth doped region in the third doped region;
performing a first patterning process, so as to form a first trench in the substrate between the first doped region and the second doped region, and form a second trench in the third doped region, including a portion of the third doped region under a bottom of the second trench, wherein the fourth doped region is located at one side of the second trench;
forming a first dielectric layer on two sidewalls of the first trench, wherein the first dielectric layer exposes a portion of the substrate at a bottom of the first trench;
forming a second dielectric layer on a sidewall and the bottom of the second trench; and
forming a conductive layer to fill the first trench and the second trench.

12. The manufacturing method of claim 11, wherein the first doped region and the fourth doped region have a first conductivity type, and the second doped region and the third doped region have a second conductivity type.

13. The manufacturing method of claim 12, further comprising:
forming a fifth doped region in the third doped region, wherein the fifth doped region is located at another side of the second trench; and
forming a sixth doped region in the fourth doped region, wherein the fifth doped region has the first conductivity type, and the sixth doped region has the second conductivity type.

14. The manufacturing method of claim 11, wherein a width of the first trench is equal to a width of the second trench, and a depth of the first trench is equal to a depth of the second trench.

15. The manufacturing method of claim 11, wherein a width of the first trench is greater than a width of the second trench, and a depth of the first trench is greater than a depth of the second trench.

16. The manufacturing method of claim 11, wherein a method of forming the first dielectric layer comprises:
forming a nitride layer on the substrate;
forming a mask layer to cover the second area;
removing the nitride layer in the first area by using the mask layer as a mask;
removing the mask layer;
forming an oxide layer on the sidewall of the first trench; and
removing the nitride layer in the second area.

17. The manufacturing method of claim 11, wherein a method of forming the second dielectric layer comprises:
- forming a nitride layer on the substrate;
- forming a mask layer to cover the first area;
- removing the nitride layer in the second area by using the mask layer as a mask;
- removing the mask layer;
- forming an oxide layer on the sidewall and the bottom of the second trench; and
- removing the nitride layer in the first area.

18. The manufacturing method of claim 11, wherein a method of forming the conductive layer comprises:
- forming a conductive material layer on the substrate, wherein the conductive material layer fills the first trench and the second trench; and
- performing a second patterning process to remove the conductive material layer around the first trench and the second trench.

19. The manufacturing method of claim 11, wherein a protruding height, from a top surface of the substrate, of the conductive layer in the first trench is equal to a protruding height, from the top surface of the substrate, of the conductive layer in the second trench.

20. The manufacturing method of claim 11, wherein the conductive layer in the first trench is electrically connected to the substrate.

* * * * *